US010279653B2

(12) United States Patent
Takagi et al.

(10) Patent No.: US 10,279,653 B2
(45) Date of Patent: May 7, 2019

(54) POWER CONVERTER

(71) Applicant: Hitachi Automotive Systems, Ltd., Hitachinaka-shi, Ibaraki (JP)

(72) Inventors: Yusuke Takagi, Hitachinaka (JP); Takahiro Shimura, Hitachinaka (JP); Takashi Kuboki, Hitachinaka (JP); Akira Matsushita, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/518,303

(22) PCT Filed: Oct. 7, 2015

(86) PCT No.: PCT/JP2015/078434
§ 371 (c)(1),
(2) Date: Apr. 11, 2017

(87) PCT Pub. No.: WO2016/076040
PCT Pub. Date: May 19, 2016

(65) Prior Publication Data
US 2017/0313159 A1   Nov. 2, 2017

(30) Foreign Application Priority Data

Nov. 13, 2014  (JP) .................................. 2014-230289

(51) Int. Cl.
*H05K 7/20* (2006.01)
*B60H 1/00* (2006.01)
(Continued)

(52) U.S. Cl.
CPC ..... *B60H 1/00914* (2013.01); *H01L 23/3675* (2013.01); *H01L 23/42* (2013.01);
(Continued)

(58) Field of Classification Search
None
See application file for complete search history.

(56) References Cited

U.S. PATENT DOCUMENTS 7,965,508 B2 *  6/2011  Yamamoto ............ H01L 23/473
                                                    174/15.1
7,978,471 B2 *  7/2011  Tokuyama .............. H01L 23/36
                                                    361/699
(Continued)

FOREIGN PATENT DOCUMENTS

JP   2008-198750 A    8/2008
JP   2011-109740 A    6/2011
(Continued)

OTHER PUBLICATIONS

International Search Report (PCT/ISA/210) issued in PCT Application No. PCT/JP2015/078434 dated Jan. 12, 2016 with English translation (three (3) pages).
(Continued)

*Primary Examiner* — Courtney L Smith
(74) *Attorney, Agent, or Firm* — Crowell & Moring LLP

(57) ABSTRACT

The present invention aims to suppress a coolant from bypassing a non-cooling unit without lowering the productivity.
The power converter according to the present invention includes: a power semiconductor module; and a flow path forming body having a flow path in which the power semiconductor module is disposed and an opening which is connected with the flow path, wherein the power semiconductor module includes a first fin formed on one surface and a second fin formed on another surface which faces the one surface so as to sandwich the semiconductor element, the flow path forming body has a first coolant control unit and a second coolant control unit which are arranged so as to sandwich the first fin, the first coolant control unit and the
(Continued)

second coolant control unit are formed to be overlapped with a region of the power semiconductor module where the first fin is not formed, and a first flow path is formed along the first coolant control unit and the second coolant control unit.

5 Claims, 10 Drawing Sheets

(51) Int. Cl.
    *H02M 7/00*           (2006.01)
    *H01L 23/367*        (2006.01)
    *H01L 23/42*         (2006.01)
    *H01L 23/473*        (2006.01)
    *H01L 23/492*        (2006.01)
    *H02M 7/537*        (2006.01)

(52) U.S. Cl.
    CPC .......... *H01L 23/473* (2013.01); *H02M 7/003* (2013.01); *H05K 7/20927* (2013.01); *H01L 23/492* (2013.01); *H02M 7/537* (2013.01)

(56) References Cited

U.S. PATENT DOCUMENTS

| | | | | |
|---|---|---|---|---|
| 9,474,189 | B2* | 10/2016 | Kawauchi | H02M 7/003 |
| 9,723,764 | B2* | 8/2017 | Sugita | H05K 7/20927 |
| 2006/0284308 | A1* | 12/2006 | Harada | H01L 25/072 |
| | | | | 257/729 |
| 2009/0231811 | A1* | 9/2009 | Tokuyama | H01L 23/36 |
| | | | | 361/699 |
| 2014/0118934 | A1* | 5/2014 | Tokuyama | H05K 7/1432 |
| | | | | 361/689 |
| 2014/0233204 | A1* | 8/2014 | Tokuyama | H02M 7/003 |
| | | | | 361/820 |
| 2015/0223366 | A1* | 8/2015 | Horiuchi | H02M 7/003 |
| | | | | 361/689 |
| 2015/0349656 | A1* | 12/2015 | Tokuyama | H01L 23/36 |
| | | | | 363/132 |
| 2015/0382501 | A1 | 12/2015 | Horiuchi et al. | |
| 2017/0325360 | A1* | 11/2017 | Tanie | H05K 7/20418 |

FOREIGN PATENT DOCUMENTS

| | | |
|---|---|---|
| JP | 2011-114965 A | 6/2011 |
| JP | 2014-166080 A | 9/2014 |

OTHER PUBLICATIONS

Japanese-language Written Opinion (PCT/ISA/237) issued in PCT Application No. PCT/JP2015/078434 dated Jan. 12, 2016 (four (4) pages).

Japanese-language Office Action issued in counterpart Japanese Application No. 2016-558931 dated Jun. 5, 2018 with English translation (nine (9) pages).

\* cited by examiner

POWER CONVERTER

TECHNICAL FIELD

The present invention relates to a power converter.

BACKGROUND ART

Recently, in accordance with the prevalence of hybrid electric vehicles and electric vehicles, necessity for the heat dissipation control of power converters has been increased. Then, improvement of the coolability has been attempted by immersing a power semiconductor module in a flow path that allows a coolant to flow.

Whereas, in a structure for inserting a power semiconductor module into a flow path, a coolant flows bypassing a fin so as to decrease a flow rate of the coolant that is supplied to the fin, thereby lowering the coolability of the power semiconductor module.

According to a technique described in a patent literature (JP 2011-114965 A), a flow path control member is installed between a fin and a frame body or between a fin and a flow path forming body so as to suppress the coolant from bypassing the fin.

However, since automation of such installation of the flow path control member is difficult, there has been a problem in productivity.

CITATION LIST

Patent Literature

PTL 1: Publication of JP 2011-114965 A

SUMMARY OF INVENTION

Technical Problem

The problem of the present invention is to suppress a coolant from bypassing a cooling unit without lowering the productivity.

Solution to Problem

A power converter according to the present invention includes: a power semiconductor module having a semiconductor element; and a flow path forming body including a flow path in which the power semiconductor module is disposed and an opening which is connected with the flow path, wherein the power semiconductor module includes a first fin formed on one surface and a second fin formed on another surface which faces the one surface so as to sandwich the semiconductor element, the flow path forming body has a first coolant control unit and a second coolant control unit which are disposed so as to sandwich the first fin, the first coolant control unit and the second coolant control unit are formed to be overlapped with a region of the power semiconductor module where the first fin is not formed, when being seen from a direction perpendicular to the one surface of the power semiconductor module, and a first flow path which is formed along the first coolant control unit and the second coolant control unit; a turning flow path which is formed on a side opposite to the opening via the power semiconductor module; and a second flow path which is formed along the power semiconductor module to have a flowing direction reverse to that of the first flow path are provided.

Effects of Invention

According to the present invention, the productivity and the coolability can be enhanced.

DESCRIPTION OF EMBODIMENTS

Figure 2:
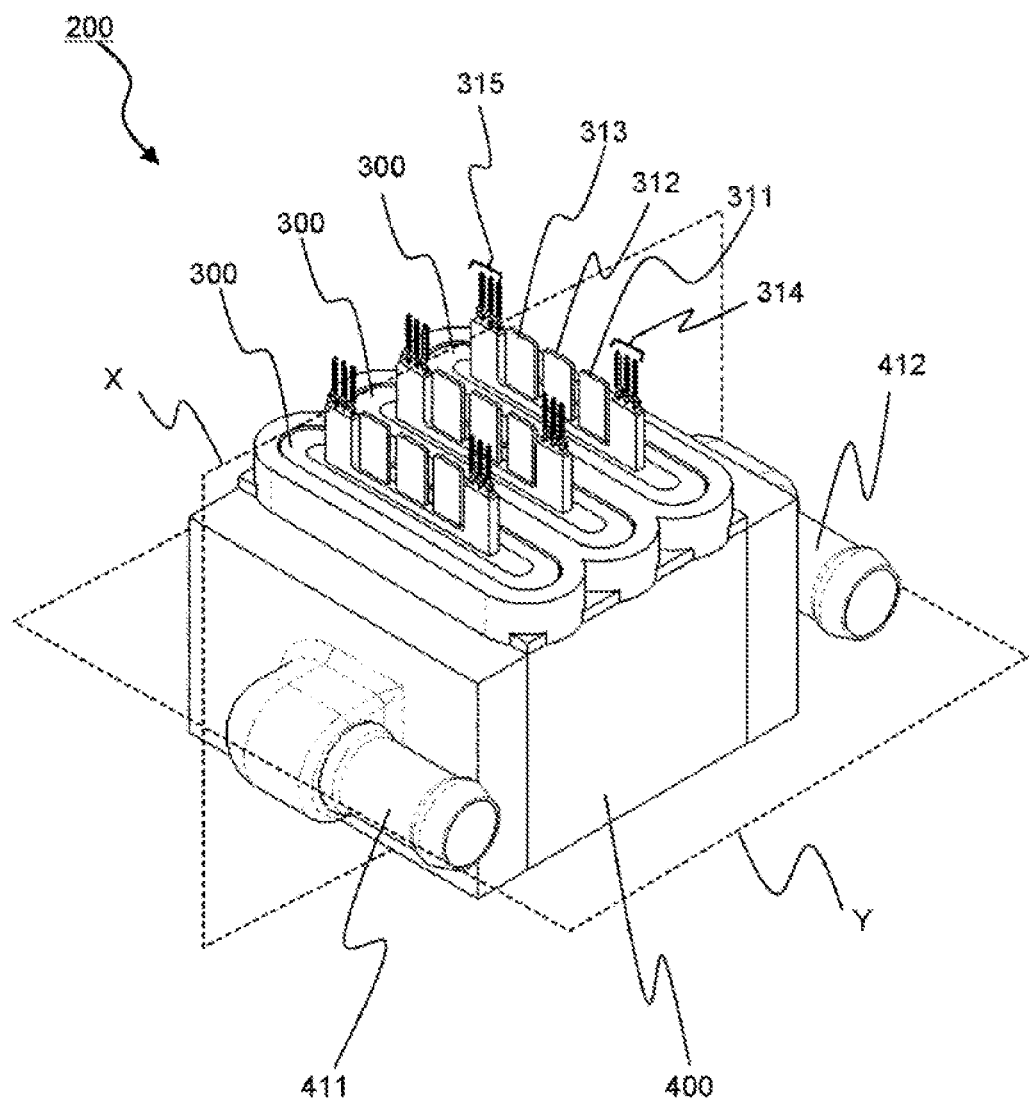
FIG. 2 is an external perspective view illustrating the power converter 200 according to a present embodiment.

An embodiment for carrying out the present invention will be described with reference to the drawings. FIG. 2 is an external perspective view illustrating a power converter 200 according to the present embodiment.

The power converter 200 inputs/outputs three-phase alternating current (AC) power including a U-phase, a V-phase and a W-phase into/from a motor generator.

Power semiconductor modules 300 are provided corresponding to the three phases of the U-phase, the V-phase and the W-phase respectively, and each of the power semiconductor modules 300 inputs/outputs direct current (DC) power via a positive electrode terminal 311 and a negative electrode terminal 312. Further, the power semiconductor module 300 inputs/outputs AC power via an AC terminal 313. Signal terminals 314 and 315 receive a control signal from a driver circuit.

Moreover, the power semiconductor module 300 is provided with a semiconductor element which receives the control signal and performs a conducting operation or a blocking operation so as to convert the supplied DC power into three-phase AC power.

Then, the power semiconductor module 300, which generates heat according to the operation of the semiconductor element, is cooled by a coolant supplied from outside.

The power converter 200 is provided with a flow path forming body 400 for storing the power semiconductor modules 300.

The flow path forming body 400 is provided with: a first pipe 411 that is an inlet for the coolant; and a second pipe 412 that is an outlet for the coolant. The first pipe 411 and the second pipe 412 are pressed into the flow path forming body 400. Incidentally, the flow path forming body 400 is made of aluminum, resin or the like.

Figure 3:
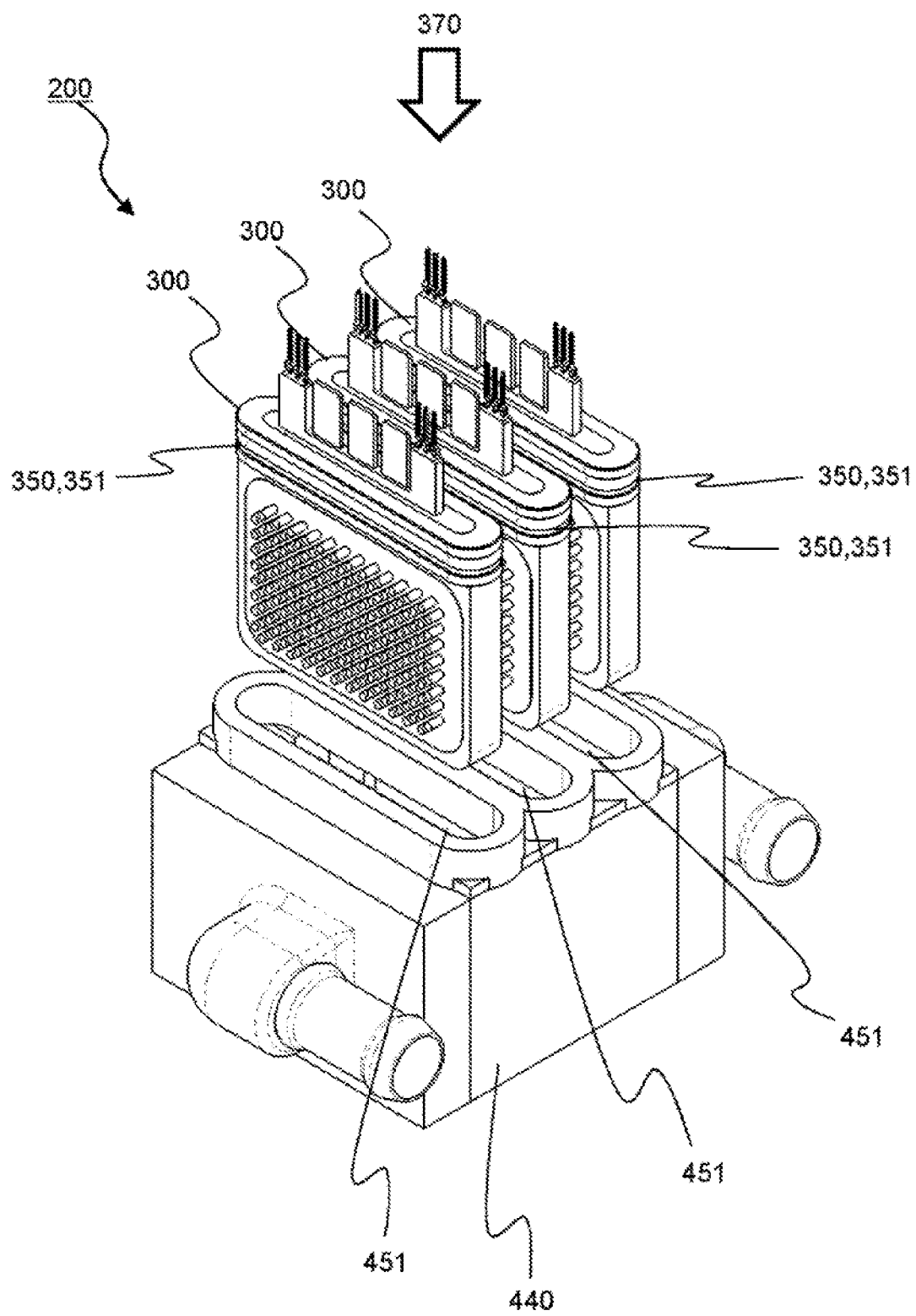
FIG. 3 is an expanded perspective view illustrating the power converter 200 according to the present embodiment.

FIG. 3 is an expanded perspective view illustrating the power converter 200 according to the present embodiment.

The flow path forming body 400 has openings 451 in which the three power semiconductor modules 300 are to be inserted respectively. Each of the power semiconductor modules 300 is inserted into the opening 451 in an insertion direction 370.

Further, the power semiconductor module 300 is provided with sealing members 351 for sealing the openings 451. Each of the sealing members 351 is provided to a seal portion 350 of the power semiconductor module 300. The seal portion 350 may be sealed by an adhesive agent, brazing or welding.

Figure 1:
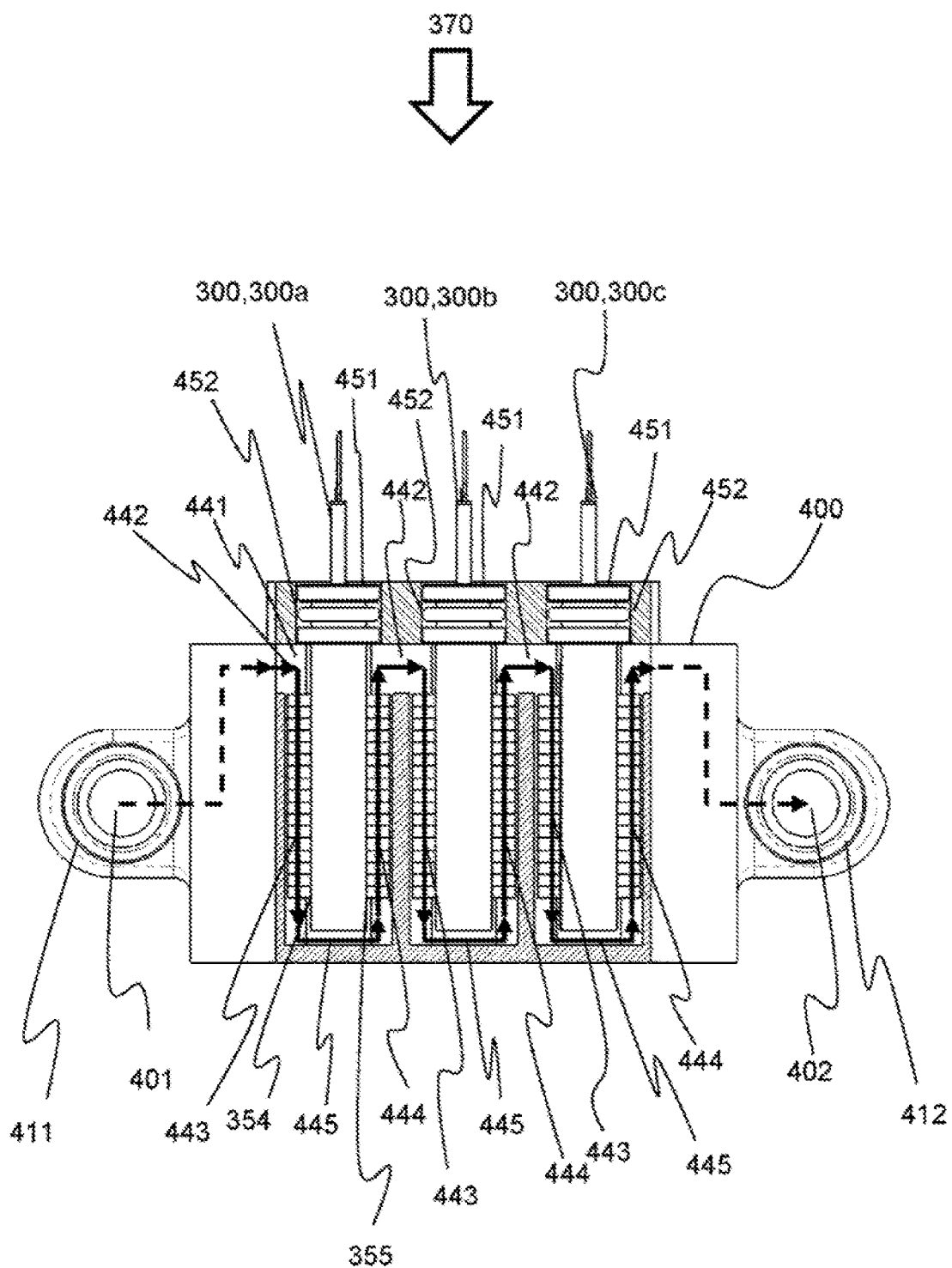
FIG. 1 is a cross-sectional view X of a power converter 200, which is taken along a plane X in FIG. 2.
Figure 4:
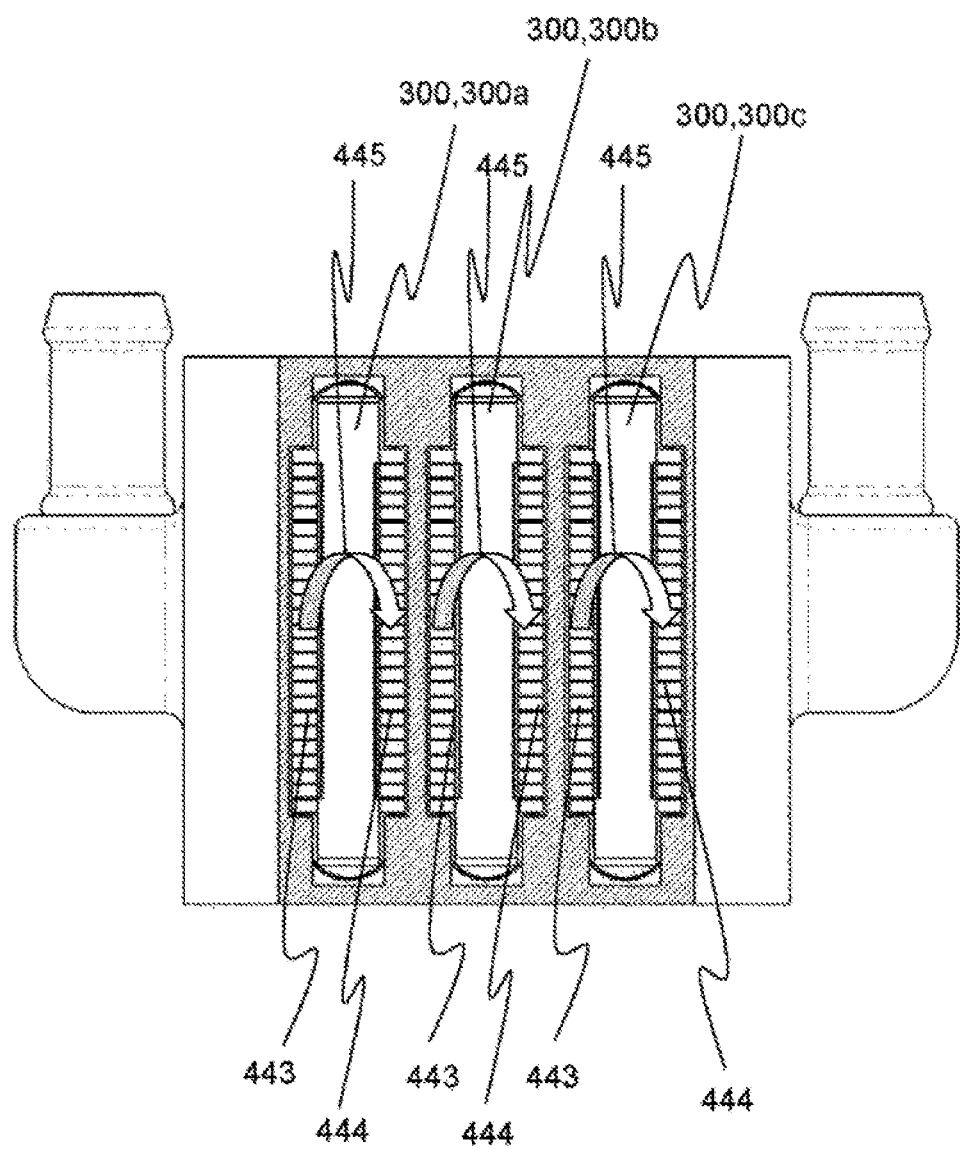
FIG. 4 is a cross-sectional view Y of the power converter 200, which is taken along a plane Y in FIG. 2.

FIG. 1 is a cross-sectional view X of the power converter 200, which is taken along a plane X in FIG. 2. FIG. 4 is a cross-sectional view Y of the power converter 200, which is taken along a plane Y in FIG. 2.

The flow path forming body 400 is provided with a flow path 441 for allowing the coolant to flow therein. The flow path 441 is formed to be connected with the opening 451. The inlet 442 is formed in the flow path forming body 400 on a side closer to a seal portion 452, that is, on a side closer to the seal portion 350 of the power semiconductor module 300.

A first flow path 443 is formed on a side of one surface 354 of the power semiconductor module 300. The first flow path 443 is formed so that the coolant may flow in a direction away from the seal portion 452.

A second flow path 444 is formed on a side of other surface 355 of the power semiconductor module 300. The second flow path 444 is formed so that the coolant may flow in a direction approaching the seal portion 452.

A turning flow path 445 is formed on a side opposite to the opening 451 of the flow path forming body 400. The turning flow path 445 is disposed to connect the first flow path 443 with the second flow path 444. The coolant flows through the first flow path 443, the turning flow path 445 and the second flow path 444 so as to cool the power semiconductor module 300. The first flow path 443 and the second flow path 444 are formed so that the flowing direction of the coolant may be parallel to the insertion direction 370.

Each of a first power semiconductor module 300a, a second power semiconductor module 300b and a third power semiconductor module 300c corresponds to either of the U-phase, the V-phase and the W-phase. The first power semiconductor module 300a, the second power semiconductor module 300b and the third power semiconductor module 300c have the same structures as those of the power semiconductor modules 300 shown in FIGS. 2 and 3.

The first pipe 411 is disposed on a side surface of the flow path forming body 400, and is provided with a flow path lead-in unit 401 for supplying the coolant to the flow path 441. The flow path lead-in unit 401 is disposed at a substantially central part of the side surface of the flow path forming body 400, and is connected with the inlet 442 so as to supply the coolant in an arrow direction.

The second pipe 412 is disposed on the side surface of the flow path forming body 400, and is provided with a flow path lead-out unit 402 for supplying the coolant to the flow path 441. The flow path lead-out unit 402 is disposed at the substantially central part of the side surface of the flow path forming body 400, and is connected with the second flow path 444 so as to supply the coolant in the arrow direction.

Figure 5:
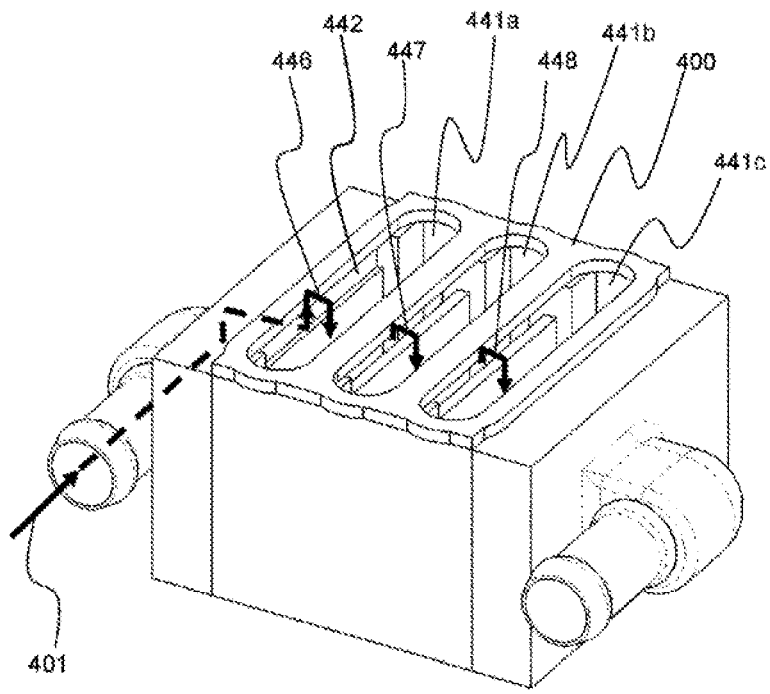
FIG. 5 is a perspective view of a flow path forming body 400, which is illustrated so that an inlet 442 can be seen.

FIG. 5 is a perspective view of the flow path forming body 400, which is illustrated so that the inlet 442 can be seen.

Figure 6:
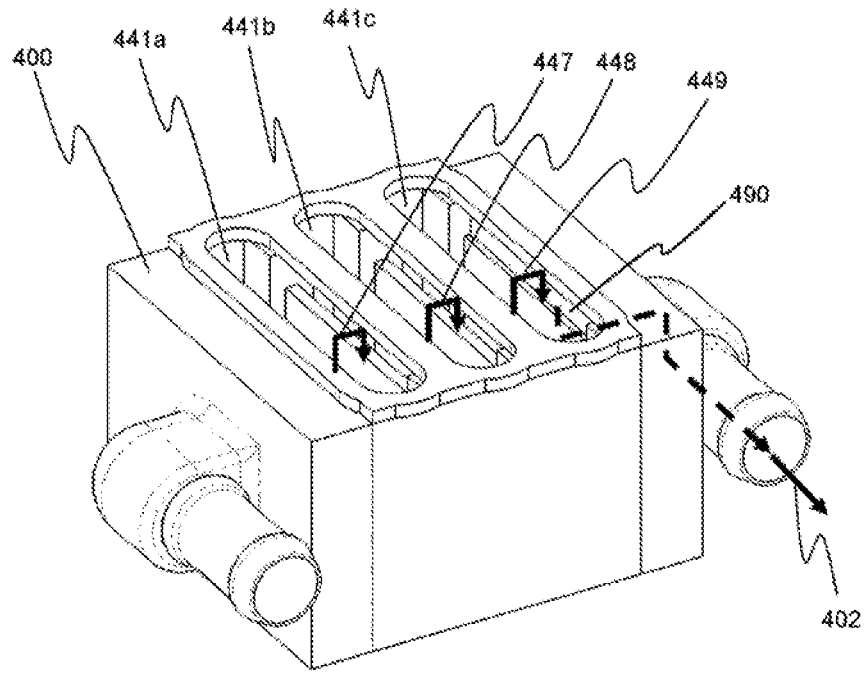
FIG. 6 is a perspective view of the flow path forming body 400, which is illustrated so that an outlet 490 can be seen.

FIG. 6 is a perspective view of the flow path forming body 400, which is illustrated so that an outlet 490 can be seen.

The flow path forming body 400 includes: a first flow path space 441a for storing the first power semiconductor module 300a; a second flow path space 441b for storing the second power semiconductor module 300b; and a third flow path space 441c for storing the third power semiconductor module 300c.

The flow path forming body 400 has flow path walls respectively between the first flow path space 441a, the second flow path space 441b and the third flow path space 441c.

As shown in FIG. 5, the flow path forming body 400 is provided with a first connecting unit 446 for connecting the flow path lead-in unit 401 with the first flow path space 441a. Further, the flow path forming body 400 is provided with a second connecting unit 447 for connecting the first flow path space 441a with the second flow path space 441b. Moreover, the flow path forming body 400 is provided with a third connecting unit 448 for connecting the second flow path space 441a with the third flow path space 441b. Moreover, as shown in FIG. 6, the flow path forming body 400 is provided with a fourth connecting unit 449 for connecting the third flow path space 441c with the flow path lead-out unit 402.

Figure 7:
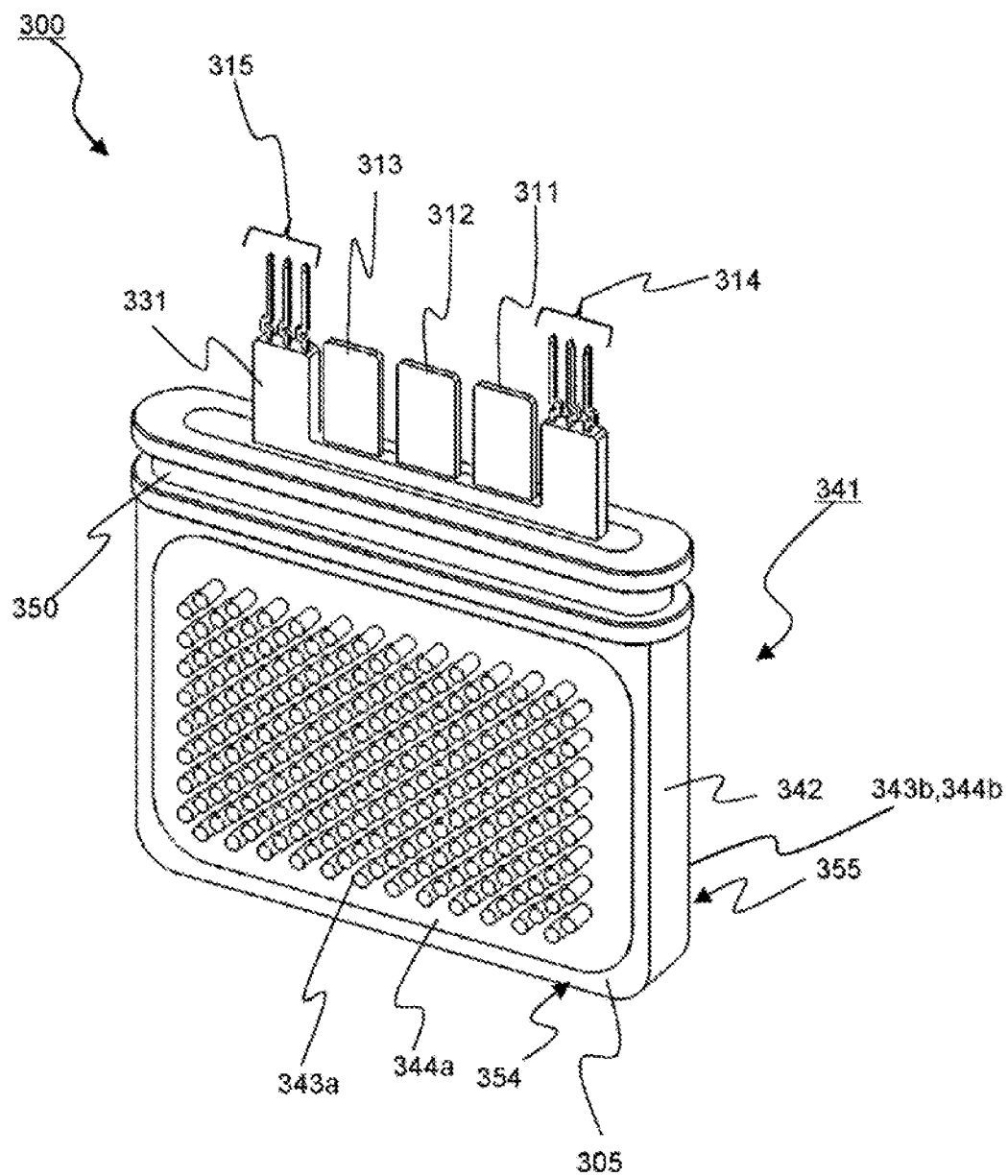
FIG. 7 is an external perspective view illustrating a power semiconductor module 300.

FIG. 7 is an external perspective view illustrating the power semiconductor module 300.

The power semiconductor module 300 inputs/outputs DC power via the positive electrode terminal 311 and the negative electrode terminal 312. The AC terminal 313 outputs AC power. The signal terminals 314 and 315 receive a control signal from the driver circuit.

Encapsulation resin 331 encapsulates a part of the positive electrode terminal 311, a part of the negative electrode terminal 312, a part of the signal terminals 314 and 315 and further the semiconductor element. A case 341 stores a part of the encapsulation resin 331.

The case 341 includes: a first heat dissipation base unit 344a which has a first fin 343a; a second heat dissipation base unit 344b which is disposed to face the first heat dissipation base unit 344a and has a second fin 343b; and a frame body 342 for connecting the first heat dissipation base unit 344a with the second heat dissipation base unit 344b.

The first fin 343a is formed on the one surface 354 of the power semiconductor module 300. The second fin 343b is formed on the other surface 355 of the power semiconductor module 300.

The frame body 342 is connected with the first heat dissipation base unit 344a via a connecting unit 305. The second heat dissipation base unit 344b is similarly connected with the frame body 342.

The first fin 343a, the second fin 343b, the first heat dissipation base unit 344a and the second heat dissipation base unit 344b are preferably made of materials having high heat conductivity, and are made of a pure aluminum material, pure copper, copper alloy or the like. The frame body 342 is preferably made of a rigid material which facilitates its production, and is made of an aluminum die-casting material, duralumin or the like.

The connecting unit 305 is jointed by friction stir welding (FSW) or brazing so as to seal the frame body 342 with the first heat dissipation base unit 344a and the frame body 342 with the second heat dissipation base unit 344b. Incidentally, this sealing may be performed with an O ring or an adhesive agent.

Figure 8:
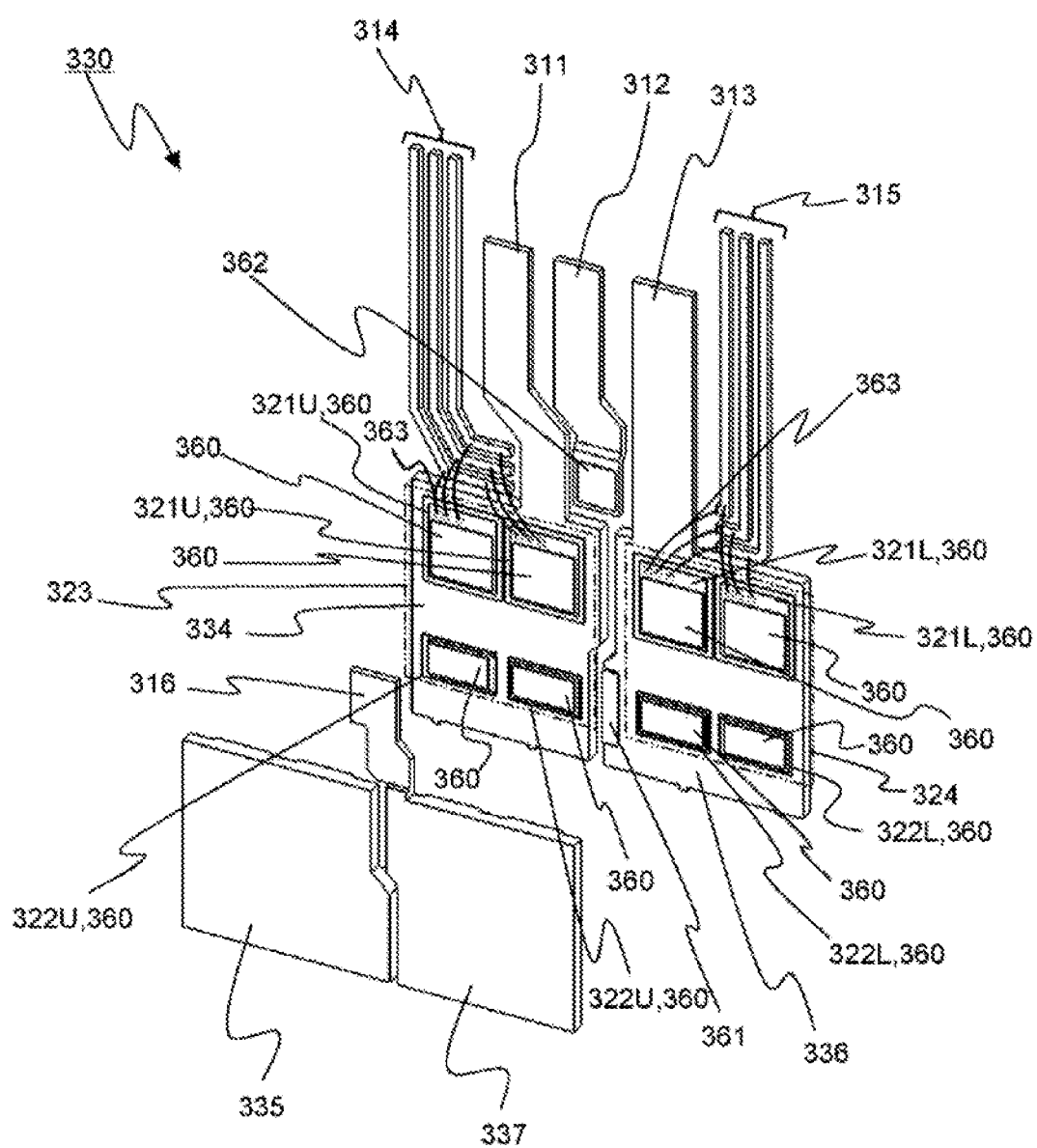
FIG. 8 is an exploded perspective view illustrating a circuit body 330 with no encapsulation resin 331 provided.

FIG. 8 is an exploded perspective view illustrating a circuit body 330 with no encapsulation resin 331 provided.

The circuit body 330 constitutes an upper arm and a lower arm of an inverter circuit, and is provided with an upper arm-side semiconductor element 323 and a lower arm-side semiconductor element 324.

The upper arm-side semiconductor element 323 is constituted by an insulated gate bipolar transistor (IGBT) 321U and a diode 322U. The IGBT 321U and the diode 322U are connected with a positive electrode-side conductor plate 334 and a first intermediate conductor plate 335 via solder 360.

The IGBT 321U is connected with the signal terminal 314 via a bonding wire 363 so as to receive a control signal from the driver circuit via the signal terminal 314.

The lower arm-side semiconductor element 324 is composed of an IGBT 321L and a diode 322L. The IGBT 321L and the diode 322L are connected with a second intermediate conductor plate 336 and a negative electrode-side conductor plate 337 via the solder 360.

The IGBT 321L is connected with the signal terminal 315 via the bonding wire 363 so as to receive a control signal from the driver circuit via the signal terminal 314.

As the IGBT 321U and the IGBT 321L, a metal-oxide semiconductor field-effect transistor (hereinafter, abbreviated as MOSFET) may be used.

The first intermediate conductor plate 335 is connected with the second intermediate conductor plate 336 via solder 361. The negative electrode-side conductor plate 337 is provided with an intermediate DC negative electrode terminal 316. The intermediate DC negative electrode terminal 316 is connected with the negative electrode terminal 312 via solder 362.

The positive electrode-side conductor plate 334 is connected with the positive electrode terminal 311. The second intermediate conductor plate 336 is connected with the AC terminal 313. The AC terminal 313 may be formed on the first intermediate conductor plate 335.

The positive electrode-side conductor plate 334, the first intermediate conductor plate 335, the second intermediate conductor plate 336 and the negative electrode-side conductor plate 337 are made of cupper or the like.

Figure 9:
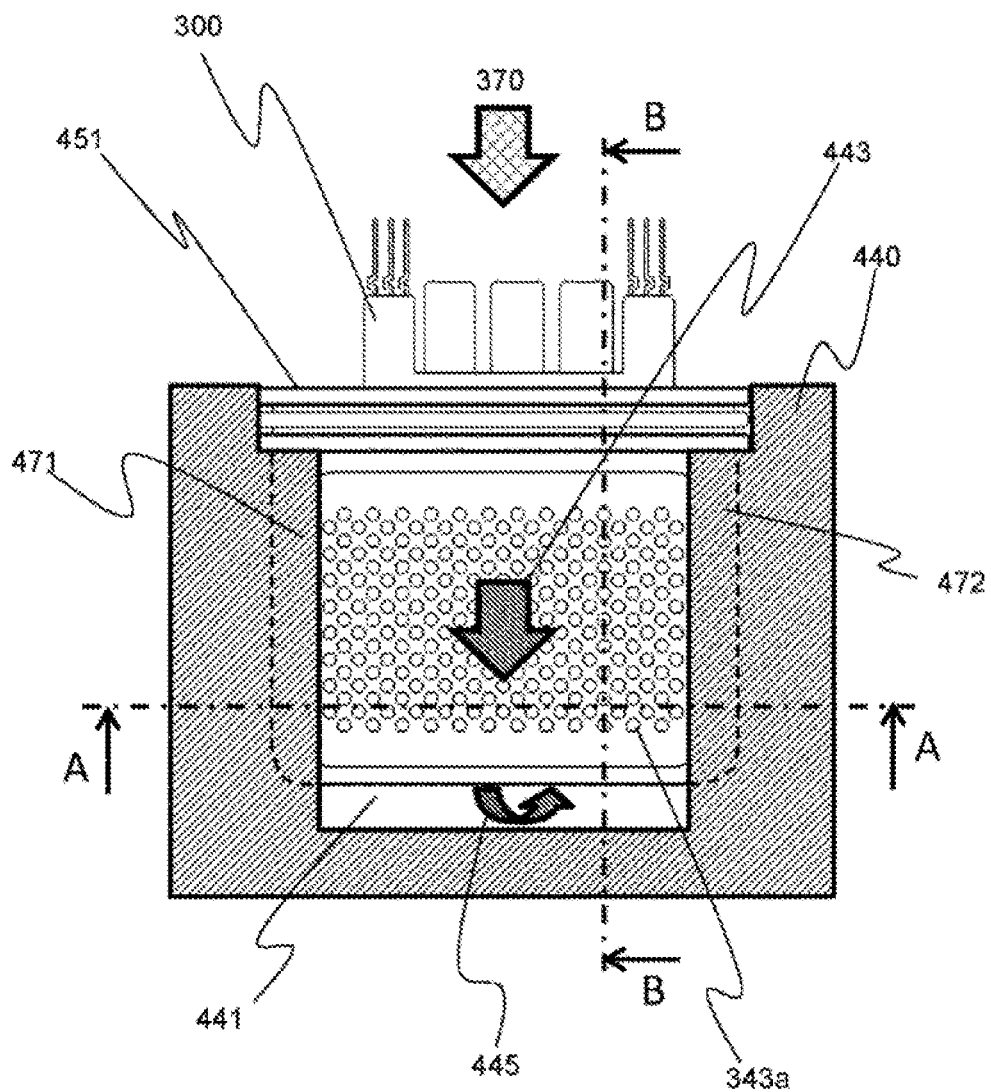
FIG. 9 is a schematic diagram illustrating an arrangement relationship between the power semiconductor module 300, a first coolant control unit 471 and a second coolant control unit 472.
Figure 10:
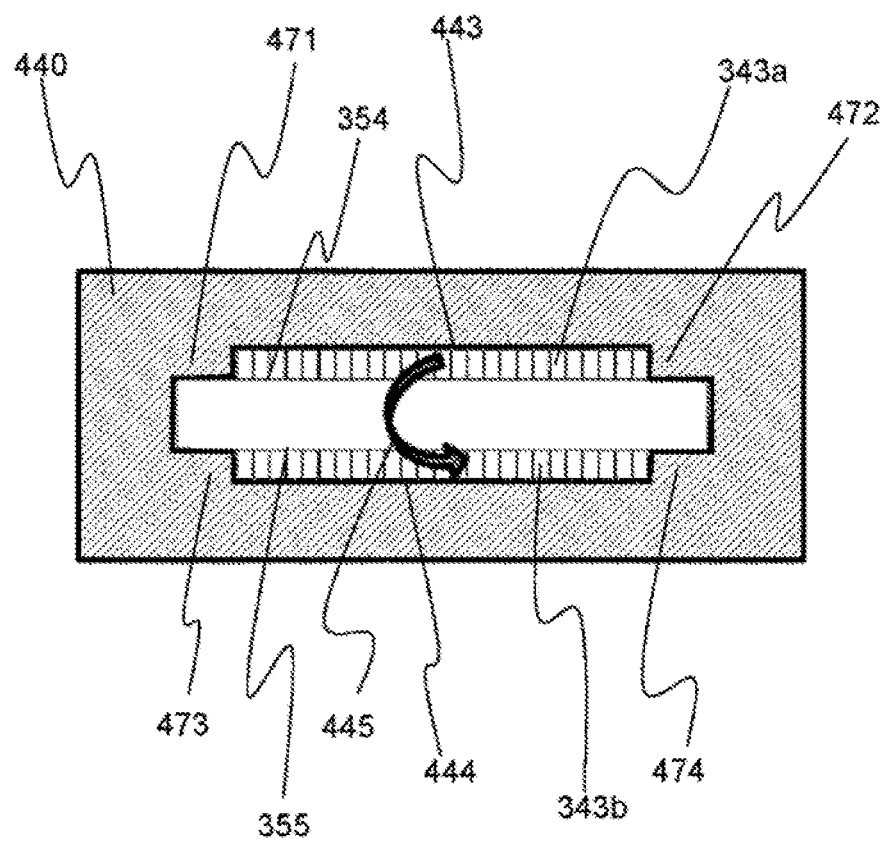
FIG. 10 is a cross-sectional view taken along a plane A-A in FIG. 9, which is seen from an arrow direction.

FIG. 9 is a schematic diagram illustrating an arrangement relationship between the power semiconductor module 300, a first coolant control unit 471 and a second coolant control unit 472. FIG. 10 is a cross-sectional view taken along a plane A-A in FIG. 9, which is seen from an arrow direction.

As shown in FIG. 10, the power semiconductor module 300 includes: the first fin 343a formed on the one surface 354; and the second fin 343b formed on the other surface 355 that faces the one surface 354.

As shown in FIG. 9, the power semiconductor module 300 is inserted into the opening 451 that is provided to the flow path forming body 400 along the insertion direction 370. The flow path forming body 400 is provided with the first coolant control unit 471 and the second coolant control unit 472 so that they may sandwich the first fin 343a. The first coolant control unit 471 and the second coolant control unit 472 are formed to be overlapped with a region of the power semiconductor module 300 where the first fin 343a is not formed, when being seen from a direction perpendicular to the one surface 354 of the power semiconductor module 300.

The flow path forming body 400 is provided with the first flow path 443 that is formed along the first coolant control unit 471 and the second coolant control unit 472. Further, the flow path forming body 400 is provided with the turning flow path 445, which is formed on a side opposite to the opening 451, via the power semiconductor module 300. Moreover, the flow path forming body 400 is provided with the second flow path 444 which is formed along the power semiconductor module 300 to have a flowing direction reverse to that of the first flow path 443.

By disposing the first coolant control unit 471 and the second coolant control unit 472 on the one surface on which the first fin 343a is not formed, the coolant is prevented from bypassing a side surface of the fin, thereby suppressing the deterioration of the coolability.

The first flow path 443 and the second flow path 444 are along the first coolant control unit 471, the second coolant control unit 472 and the power semiconductor module 300, whereby the flow path 441 can be formed integrally with the flow path forming body 400.

By constituting the first coolant control unit 471 and the second coolant control unit 472 integrally with the flow path forming body 400, the flow path control member is not necessary to be installed, so that assembly man-hours and the number of constituent members can be reduced, thereby enhancing the productivity.

As shown in FIG. 10, the flow path forming body 400 is provided with a third coolant control unit 473 and a fourth coolant control unit 474 so that they may sandwich the second fin 343b. The third coolant control unit 473 and the fourth coolant control unit 474 are formed to be overlapped with a region of the power semiconductor module 300 where the first fin 343b is not formed, when being seen from a direction perpendicular to the other surface 355 of the power semiconductor module 300.

The third coolant control unit 471 and the fourth coolant control unit 472 can suppress the coolant from flowing toward other surface 345 on which the second fin 343a is not formed, thereby obtaining the effects similar to those of the first coolant control unit 471 and the second coolant control unit 472.

In the case where the first coolant control unit 471 and the second coolant control unit 472 are formed along a direction different from the insertion direction 370, an opening, beside the opening 451, for processing becomes necessary. In the present embodiment, the first coolant control unit 471 and the second coolant control unit 472 are formed along the insertion direction 370 for inserting the power semiconductor module 300 from the opening 451 into the flow path 441. Thereby, the production can be facilitated, which enhances the productivity.

Figure 11:
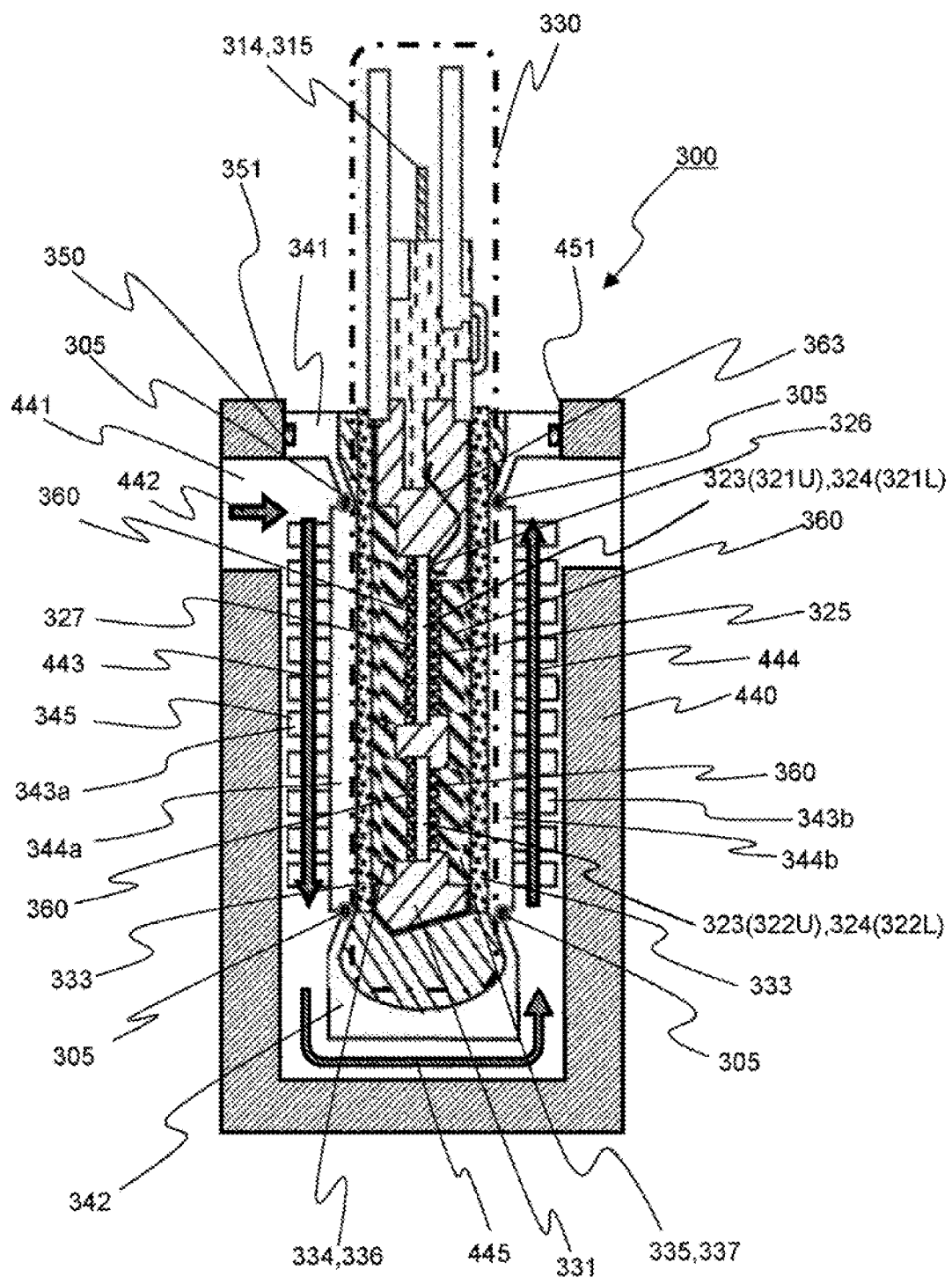
FIG. 11 is a cross-sectional view of the power semiconductor module 300 and the flow path forming body 400, which is taken along a plane B-B in FIG. 9.

FIG. 11 is a cross-sectional view of the power semiconductor module 300 and the flow path forming body 400, which is taken along a plane B-B in FIG. 9.

The circuit body 330 is stored in the case 341 in a state where the semiconductor element and the conductor plates are encapsulated with the encapsulation resin 331 and are insulated by an insulation sheet 333 that functions as an insulation member. The semiconductor element constitutes the upper arm-side semiconductor element 323 and the lower arm-side semiconductor element 324 of the inverter circuit. The upper arm-side semiconductor element 323 includes the IGBT 321U and the diode 322U. The lower arm-side semiconductor element 324 includes the IGBT 321L and the diode 322L. The conductor plates are connected with the semiconductor element via the solder 360 so as to sandwich the semiconductor element.

The conductor plates are composed of: the positive electrode-side conductor plate 334; the first intermediate conductor plate 335; the second intermediate conductor plate 336; and the negative electrode-side conductor plate 337. The IGBT 321U is connected with the signal line 314 via the bonding wire 363. The IGBT 322L is connected with the signal line 315 via the bonding wire 363.

The case 341 is constituted by: the first heat dissipation base unit 344a; the second heat dissipation base unit 344b; and the frame body 342. The frame body 342 is connected with each of the first heat dissipation base unit 344a and the second heat dissipation base unit 344b via the connecting unit 305.

The fin is constituted by: the first fin 343a; and the second fin 343b. The first fin 343a is formed on the one surface 354 of the power semiconductor module 300. The second fin 343b is formed on the other surface 355 that faces the one surface 354 so that the first fin 343a and the second fin 343b may sandwich the semiconductor element.

The power semiconductor module 300 is stored in the flow path forming body 400 that has the flow path 441. The flow path forming body 400 is provided with the opening 451 so as to be connected with the flow path 441. The opening 451 is sealed with the seal portion 350 and the sealing member 351 that are provided to the case 341.

The flow path forming body 400 is provided with the inlet 442 at a position facing the connecting unit 305 that is provided at a position close to the seal portion 350. The inlet 442 is connected with the first flow path 443 in a direction away from the seal portion 350 along the power semiconductor module 300.

The first flow path 443 is connected with the turning flow path 445 that is provided on the side opposite to the opening 451. The turning flow path 445 is connected with the second flow path which is formed along the power semiconductor module 300 to have the direction reverse to the flowing direction of the first flow path.

Comparing to the structure of the case 341 having no connecting unit 305, the connecting unit 305 has a larger region on which the fin is not formed. The reason for this is because it is disadvantageous in production cost to form the fin onto the connecting unit 305 after the process of the connection of the first heat dissipation base unit 344a with the frame body 342.

Even if the flow path forming body 400 according to the present embodiment has the structure including the connecting unit 305, the first coolant control unit 471, the second coolant control unit 472, the third coolant control unit 473 and the fourth coolant control unit 473 shown in FIG. 9 can be formed easily, thereby enhancing the productivity.

Further, the upper arm-side semiconductor element 343 and the lower arm-side semiconductor element 344 are disposed in the direction that is substantially perpendicular to the insertion direction 370 as shown in FIG. 8, that is, they are arranged in a direction traversing the flowing direction of the coolant that flows in the first flow path 443.

Thereby, the upper arm-side semiconductor element 343 and the lower arm-side semiconductor element 344 are not overlapped with each other in the flowing direction of the coolant, so that variation of a state of the coolant between the upper and lower arms can be suppressed, thereby enhancing the coolability.

Moreover, the semiconductor element has: a first electrode plane 325 and a controlling electrode plane 326 formed on its one surface; and a second electrode plane 327 formed on its other surface. The semiconductor element has an arrangement that the second electrode plane 327 is positioned closer to the first flow path 443 than the second flow path 444. The first electrode plane 325 and the second electrode plane 327 are connected with the conductor plate via the solder 360. The conductor plate is cooled by the coolant via the heat dissipation base units 344, the first fin 343a and the second fin 343b. The first electrode plane is, for example, an emitter electrode plane. The controlling electrode plane is, for example, a gate electrode plane. The second electrode plane is, for example, a collector electrode plane.

Thereby, the second electrode plane 327 has a larger area than that of the first electrode plane 325 having the controlling electrode plane 326, and thus has a larger area that contributes to the heat dissipation. The first flow path 443 is positioned near the inlet 442, and thus has higher flow speed in the vicinity of the heat dissipation base, thereby improving the coolability.

Incidentally, the number of the power semiconductor modules 300 with respect to the one flow path forming body 400 is not limited to three, and may be, for example, one or six. The flow path 441 may be branched to allow the coolant to flow toward the plural power semiconductor modules 300, and in the case where a supply amount of the coolant can be secured sufficiently, pressure loss can be reduced more than that in the case where the flow path 441 is not branched.

REFERENCE SIGNS LIST 200 power converter
300 power semiconductor module
300a first power semiconductor module
300b second power semiconductor module
300c third power semiconductor module
305 connecting unit
311 positive electrode terminal
312 negative electrode terminal
313 alternating current (AC) terminal
314 signal terminal
315 signal terminal
316 intermediate direct current (DC) negative electrode terminal
321L IGBT
321U IGBT
322L diode
322U diode
323 upper arm-side semiconductor element
324 lower arm-side semiconductor element
330 circuit body
331 encapsulation resin
333 insulation sheet
334 positive electrode-side conductor plate
335 first intermediate conductor plate
336 second intermediate conductor plate
337 negative electrode-side conductor plate
341 case
342 frame body
343a first fin
343b second fin
344a first heat dissipation base unit
344b second heat dissipation base unit
350 seal portion
351 sealing member
354 one surface
355 other surface
360 solder
361 solder
362 solder
363 bonding wire
370 insertion direction
401 flow path lead-in unit
402 flow path lead-out unit
440 flow path forming body
411 first pipe 412 second pipe
441 flow path
441a first flow path space
441b second flow path space
441c third flow path space
442 inlet
443 first flow path
444 second flow path
445 turning flow path
446 first connecting unit
447 second connecting unit
448 third connecting unit
449 fourth connecting unit
451 opening
452 seal portion
471 first coolant control unit
472 second coolant control unit
473 third coolant control unit
474 fourth coolant control unit

The invention claimed is:

1. A power converter comprising:
a power semiconductor module having a semiconductor element; and
a flow path forming body including a flow path in which the power semiconductor module is disposed and an opening which is connected with the flow path, wherein
the power semiconductor module includes a first fin formed on one surface and a second fin formed on another surface, so as to sandwich the semiconductor element,
the flow path forming body has a first coolant control unit and a second coolant control unit which are disposed so as to sandwich the first fin,
the first coolant control unit and the second coolant control unit are formed integrally with the flow path forming body, being formed to be overlapped with a region of the power semiconductor module where the first fin is not formed, when being seen from a direction perpendicular to the one surface of the power semiconductor module, and the first coolant control unit and the second coolant control unit are formed along an insertion direction for inserting the power semiconductor module from the opening into the flow path, and
a first flow path which is formed along the first coolant control unit and the second coolant control unit; a turning flow path which is formed on a side opposite to the opening via the power semiconductor module; and a second flow path which is formed along the power semiconductor module to have a flowing direction reverse to that of the first flow path are provided.

2. The power converter according to claim 1, wherein the power semiconductor module includes a circuit body having the semiconductor element and a case which stores the circuit body,
the case includes: a heat dissipation base unit having a fin; a frame body which is connected with the heat dissipation base unit via a connecting unit; and a seal portion which closes the opening of the flow path forming body, and
the flow path forming body faces the connecting unit which is provided at a position close to the seal portion and is provided with an inlet that is connected with the first flow path.

3. The power converter according to claim 1, wherein the semiconductor element of the power semiconductor module includes: plural upper arm-side semiconductor elements which constitute an upper arm of an inverter circuit; and plural lower arm-side semiconductor elements which constitute a lower arm of the inverter circuit, and
the plural upper arm-side semiconductor elements and the plural lower arm-side semiconductor elements are arranged in a direction traversing the flowing direction of the coolant that flows in the first flow path.

4. The power converter according to claim 3, wherein the semiconductor element includes: a first electrode plane and a controlling electrode plane formed on one surface; and a second electrode plane formed on another surface, and
the semiconductor element further has an arrangement that the second electrode plane is positioned closer to the first flow path than the second flow path.

5. The power converter according to claim 2, wherein the inlet connected with the flow path faces the fin and the connecting unit provided at the position close to the seal portion.

* * * * *